United States Patent [19]

Iwasa et al.

[11] Patent Number: 5,042,008
[45] Date of Patent: Aug. 20, 1991

[54] NON-VOLATILE SEMICONDUCTOR MEMORY DEVICE HAVING WORD LINES ("CONTROL GATES") EMBEDDED IN SUBSTRATE

[75] Inventors: Shoichi Iwasa; Masaru Ohki, both of Tokyo, Japan

[73] Assignee: NEC Corporation, Japan

[21] Appl. No.: 509,892

[22] Filed: Apr. 16, 1990

[30] Foreign Application Priority Data

Apr. 27, 1989 [JP] Japan .................... 1-108324

[51] Int. Cl.⁵ .................................... G11C 11/40
[52] U.S. Cl. .................... 365/185; 357/23.5; 357/41
[58] Field of Search .............. 357/23, 5, 41; 365/185

[56] References Cited

U.S. PATENT DOCUMENTS 4,542,396 9/1985 Schutten et al. .......... 357/73.5
4,858,185 8/1989 Kawshik et al. .......... 385/185

Primary Examiner—Joseph E. Clawson, Jr.
Attorney, Agent, or Firm—Laff Whitesel Conte & Saret

[57] ABSTRACT

A non-volatile memory device is fabricated on a semiconductor substrate structure and comprises a word line formed by a buried layer in the semiconductor substrate structure and a plurality of memory cells associated with the word line, and each of the memory cells comprises a control gate region of formed in the semiconductor substrate structure and extending from the word line to a major surface portion of the semiconductor substrate structure, a first gate insulating film covering a top surface of the control gate region, a source region of formed in the major surface portion of the semiconductor substrate structure, a drain region formed in the major surface portion of the semiconductor substrate structure and spaced from the control gate region and the source region, a second gate insulating film provided over that area between the source and drain regions, and a floating gate electrode extending from the first gate insulating film to the second gate insulating film, since the word line extends below the major surface, the word line does not consume a real estate of the semiconductor substrate structure and, accordingly, enhances the integration density of the non-volatile memory device.

8 Claims, 5 Drawing Sheets 5,042,008

NON-VOLATILE SEMICONDUCTOR MEMORY DEVICE HAVING WORD LINES ("CONTROL GATES") EMBEDDED IN SUBSTRATE

FIELD OF THE INVENTION

This invention relates to a non-volatile semiconductor memory device and, more particularly, to an EPROM cell with a control gate formed in the substrate and associated with a word line embedded below the control gate.

DESCRIPTION OF THE RELATED ART

A typical example of the EPROM cell has a double polysilicon gate structure, and one of the polysilicon gates serves as a floating gate for accumulating a bit of data information in the form of electric charges, but the other polysilicon gate forms a part of a word line. However, the prior art EPROM cell of the double polysilicon gate type is much complicate in the fabricating process and, accordingly, low in the production yield because the gate-patterning stage is repeated twice in a well-aligned manner.

In order to provide a solution to the drawbacks inherent in the prior art EPROM cell of the double polysilicon gate type, an EPROM cell with a single polysilicon gate is proposed by Kuniyoshi YOSHIKAWA et al. in "An EPROM Cell Structure for EPLDs Compatible with Single Poly Gate Process", Extended Abstracts of the 18th (1986 International) Conference on Solid State Devices and Materials, Tokyo, 1986, pages 323 to 326, and FIGS. 1 and 2 show the structure of the EPROM cell proposed by YOSHIKAWA et al. In FIGS. 1 and 2, reference numeral 1 designates a p-type silicon substrate, and n-type doped region 2A and 2B are formed in the substrate 1 as control gate electrodes. The major surface of the substrate 1 is covered with an oxide film 3 which is partially large in thickness but in part small in thickness. The thick portion 3A provides an isolation between the component elements of EPROM cells, and the thin portions 3B serves as gate oxide films, respectively. Polysilicon strips 4A and 4B serving as floating gates are formed and extend on the thin portions 3B over the thick portions 3A, respectively, and an interlevel insulating film 5 covers the entire structure. Though not shown in FIG. 2, source regions 6A and 6B are formed in the substrate 1, and drain regions 7A and 7B are located on the opposite side of the polysilicon strips 4A and 4B. An aluminum wiring strip 8A is in contact with the source regions 6A and 6B for providing a source voltage level, and the drain regions 7A and 7B are coupled to another aluminum wiring strip 8B serving as a bit line. These aluminum wiring strips 8A and 8B extend on an upper level with respect to the polysilicon strips 4A and 4B.

The EPROM cell thus arranged is advantageous over the double polysilicon gate structure in simple fabricating process and, accordingly, in the production yield because the control gate electrodes or the n-type doped regions 2A and 2B are formed in the substrate 1 and, therefore, the other gate electrodes, i.e. the polysilicon strips 4A and 4B, are concurrently completed in the patterning stage of the gate electrodes for associated component transistors. This results in a simple fabricating process.

However, a problem is encountered in the EPROM cell proposed by Yoshikawa in that the aluminum wiring strip 8A is provided for the source voltage which is supplied through a doped region in the substrate in the double polysilicon gate structure. When the source voltage is supplied through the aluminum wiring strip 8A, interconnections between the aluminum wiring strip 8A and the source regions 6A and 6B request contact windows 9A and 9B, and a large amount of real estate is consumed by the single polysilicon gate EPROM cells. Namely, the n-type doped regions 2A and 2B per se consume the substantial amount of real estate, and component transistors are widely spaced apart from the n-type doped regions 2A and 2B because any parasitic channel should be avoided in the presence of an extremely high voltage level applied to the n-type doped regions upon a write-in operation for data information. Moreover, only one contact window is formed for two double polysilicon gate EPROM cells, however, two single polysilicon gate EPROM cells request three contact windows as shown in FIG. 1. The contact windows further consume a large amount of the real estate. In fact, each single polysilicon gate EPROM cell consumes the real estate three or four times larger than that of the double polysilicon gate EPROM cell.

SUMMARY OF THE INVENTION

It is therefore an important object of the present invention to provide a non-volatile memory device which is fabricated on a small size semiconductor chip without any complicate process.

To accomplish the object, the present invention proposes to assign a buried-layer to a word line shared by a plurality of control gates.

In accordance with the present invention, there is provided a non-volatile semiconductor memory device fabricated on a semiconductor substrate structure of a first conductivity type, comprising: a) a plurality of doped regions of a second conductivity type respectively serving as word lines and formed in the semiconductor substrate structure; and b) a plurality of memory cells divided into a plurality of groups respectively coupled to the plurality of doped regions and memorizing data bits in a non-volatile manner, respectively, in which each of the memory cells comprises b-1) a control gate region of the second conductivity type formed in the semiconductor substrate structure and extending from one of the doped regions to a major surface portion of the semiconductor substrate structure, b-2) a first gate insulating film covering a top surface of the control gate region, b-3) a source region of the second conductivity type formed in the major surface portion of the semiconductor substrate structure and isolated from the control gate region, b-4) a drain region of the second conductivity type formed in the major surface portion of the semiconductor substrate structure and spaced from the control gate region and the source region, b-5) a second gate insulating film provided over that area between the source and drain regions, and b-6) a floating gate electrode extending from the first gate insulating film to the second gate insulating film.

BRIEF DESCRIPTION OF THE DRAWINGS

The features and advantages of an EPROM cell according to the present invention will be more clearly understood from the following description taken in conjunction with the accompanying drawings in which.

DESCRIPTION OF THE PREFERRED EMBODIMENTS

First Embodiment

Figure 1:
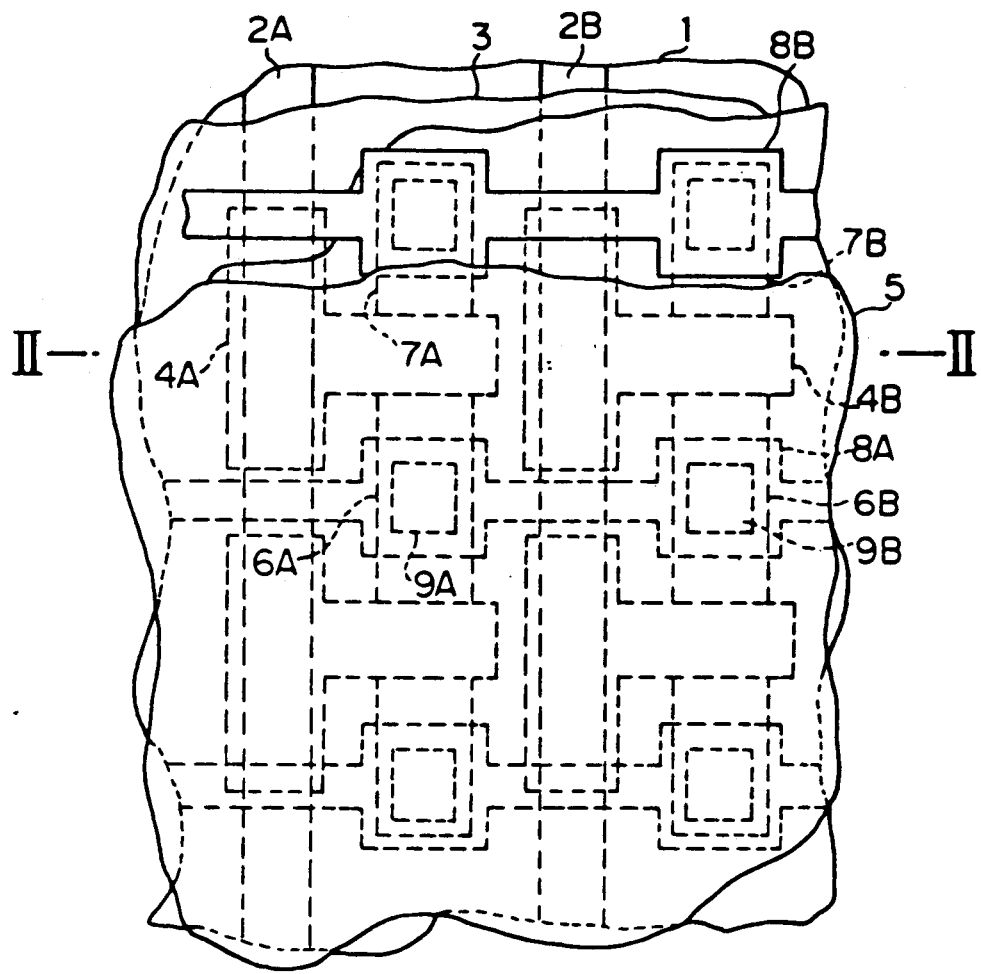
FIG. 1 is a plan view showing the layout of the single polysilicon gate EPROM cells proposed by YOSHIKAWA.
Figure 2:
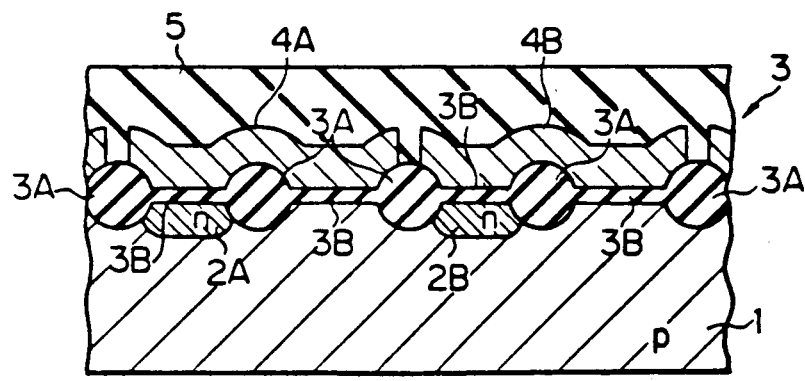
FIG. 2 is a cross sectional view taken along line II—II of FIG. 1 and showing the structure of the EPROM cell.
Figure 3:
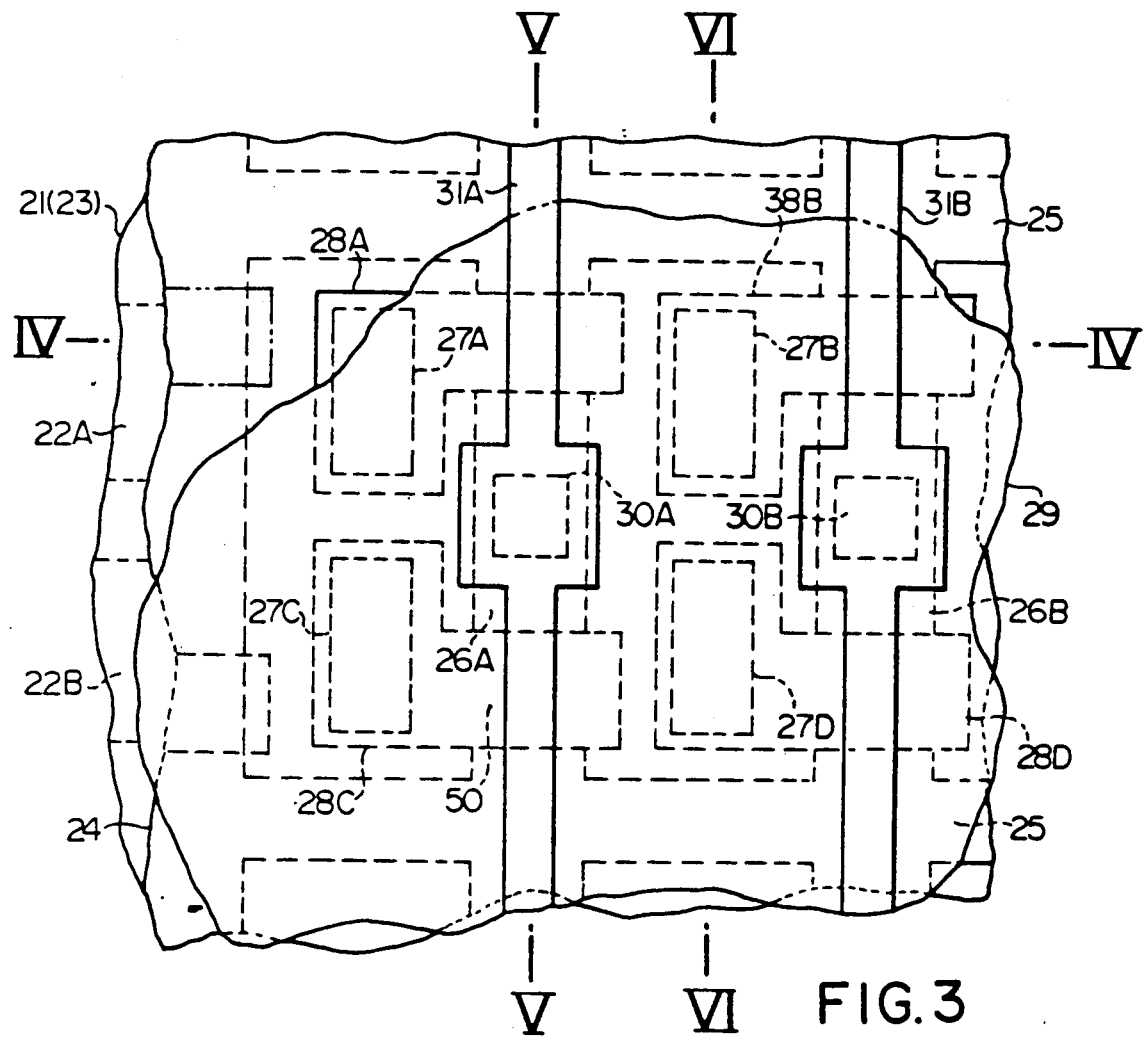
FIG. 3 is a plan view showing a part of an EPROM device embodying the present invention.
Figure 4:
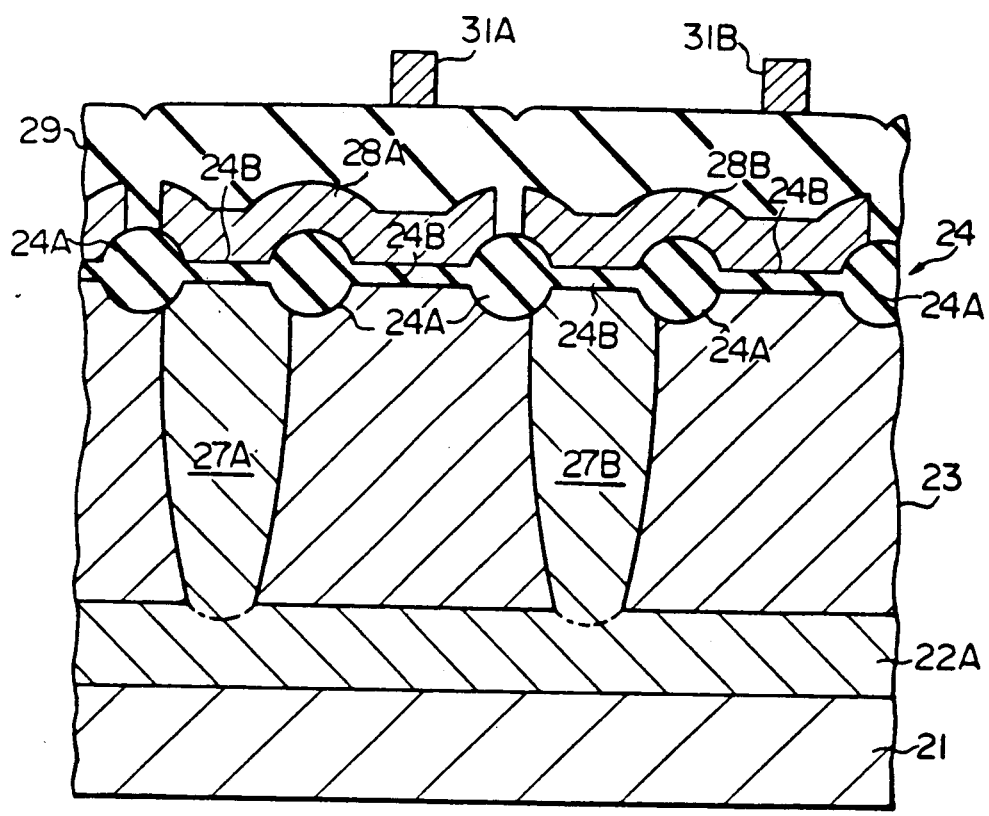
FIG. 4 is a cross sectional view taken along line IV—IV of FIG. 3 and showing the structure of the EPROM device.
Figure 5:
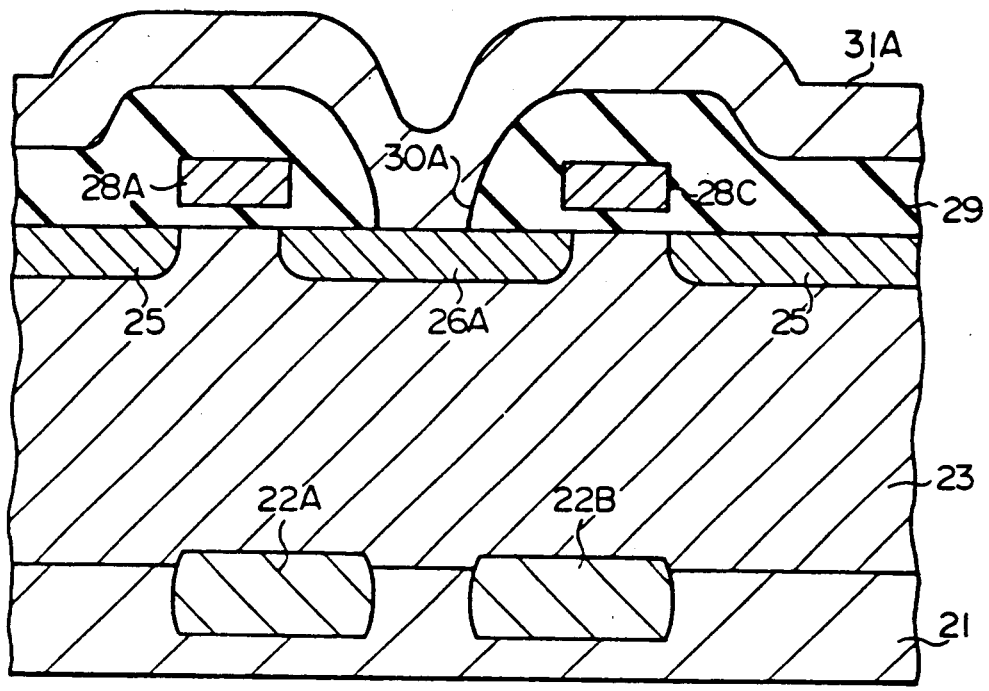
FIG. 5 is a cross sectional view taken along line V—V of FIG. 3 and showing the structure of the EPROM device.
Figure 6:
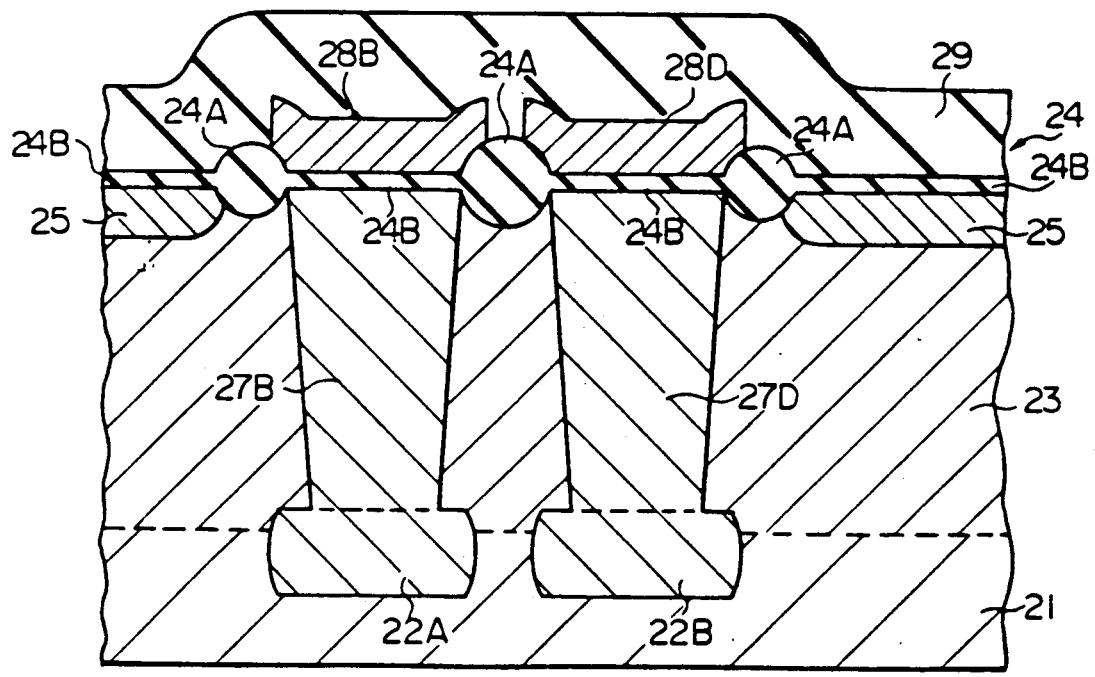
FIG. 6 is a cross sectional view taken along line VI—VI of FIG. 3 and showing the structure of the EPROM device.

Referring first to FIGS. 3 to 6, an EPROM device embodying the present invention is fabricated on a semiconductor, typically silicon, substrate 21 of a first conductivity type. In this instance, a p-type impurity is assumed to be the first conductivity type and an n-type impurity imparts a second conductivity to a semiconductor material. However, the first and second conductivities may be opposite to each other in another implementation.

On the semiconductor substrate 21 is formed buried-layers 22A and 22B of the second conductivity type which respectively provide word lines and propagate a write-in voltage level Vpp in a write-in mode of operation or a selecting signal of an ordinary voltage level in a read-out mode of operation. The buried-layer 22A is covered with an epitaxial layer 23 of the first conductivity type, and an silicon oxide film 24 is grown on the epitaxial layer 23. In this instance, the silicon substrate 21 and the epitaxial layer 23 as a whole constitute a semiconductor substrate structure. The silicon oxide film 24 is constituted by relatively thick portions 24A and relatively thin portions 24B, and the relatively thick portions 24A serves as a field oxide, but the relatively thin portions 24B are used as gate oxide films, respectively. The thick portions 24A may be grown by using a selective oxidation process. In the surface portion of the epitaxial layer 23, a common source region 25 is doped with the second conductivity type impurity atoms and defined in the epitaxial layer 23 like a belt, and drain regions 26A and 26B of the second conductivity type are further formed in the epitaxial layer 23 like islands. In the epitaxial layer 23 are further formed control gate regions 27A, 27B, 27C and 27D of the second conductivity type which extend from the surface portion of the epitaxial layer 23 and are respectively brought into contact with the buried-layers 22A and 22B. The control gate regions 27A, 27B, 27C and 27D confront boss portions of polysilicon strips 28A, 28B, 28C and 28D, respectively, and the polysilicon strips 28A to 28D serve as floating gate electrodes, respectively. The polysilicon strips 28A to 28D respectively have leading end portions projecting over the gate oxide films 24B each located on that area between the common source region 25 and the drain region 26A or 26B. In this instance, the control gate region 27A, 27B, 27C or 27D, the gate oxide film 24B, the polysilicon strip 28A, 28B, 28C or 28D, the common source region 25 as a whole constitute an EPROM cell.

The polysilicon strips 28A to 28D are covered with an inter-level insulating film 29, and contact windows 30A and 30B are formed in the inter-level insulating film 29. The contact windows 30A and 30B reach the surfaces of the drain regions 26A and 26B, respectively, and aluminum wiring strips 31A and 31B pass through the contact windows 30A and 30B, respectively, thereby being brought into contact with the drain regions 26A and 26B, respectively. The aluminum wiring strips 31A and 31B extend in parallel on the interlevel insulating film 29 and serves as a digit lines, respectively.

Description is hereinbelow made on operation of the EPROM device according to the present invention. The behaviors of the EPROM cells are similar to one another, and, for this reason, the description is focused on the EPROM cell located at the upper end of the left side in FIG. 3. When a bit of data information is written into the EPROM cell, the write-in voltage level Vpp is applied to the buried layer or the word line 22A, and the word line 22A propagates the write-in voltage level Vpp to the control gate region 27A. The write-in voltage level Vpp is determined in such a manner as to be lower than breakdown voltage level between the buried layer 22A and the epitaxial layer 23 and between the control gate region 27A and the epitaxial layer 23 and not to allow any parasitic channel to take place beneath the thick portion 24A due to ascent in voltage level at the polysilicon strip 28A or the floating gate electrode. Assuming now that no data bit has been written into the EPROM cell, the write-in voltage level Vpp at the control gate region 27A causes the polysilicon strip 28A to be increased in voltage level and reaches a certain voltage level Vc given as follows:

$$Vc \approx [C2/(C1+C2)] \times Vpp$$

where C1 is a capacitance across the gate oxide film 24B on that area 50 between the common source region 25 and the drain region 26A (which serves as a channel region in operation) and C2 is a capacitance across the gate oxide film 24B between the control gate region 27A and the polysilicon strip 28A. A channel takes place between the common source region 25 and the drain region 26A in the presence of the certain voltage level Vc, and carriers are accelerated by an electric field in the channel. A part of the carriers thus accelerated become hot carriers large enough in energy to exceed the potential barrier between the silicon and the silicon oxide as large as 3.2 eV. The hot carriers are accumulated in the polysilicon strip 28A, and vary the threshold voltage level of the EPROM cell.

In the read-out mode of the operation, the selecting signal is supplied through the buried layer or the word line 22A to the control gate region 27A, and whether or not a channel takes place depends upon the carriers accumulated in the polysilicon strip 28A. If the carriers have been accumulated in the polysilicon strip 28A, no channel takes place between the common source region 25 and the drain region 26A, so that the data bit of logic "0" level is read out from the EPROM cell. However, if no carriers is injected into the polysilicon strip 28A, a channel is produced between the common source region 25 and the drain region 26A, and a data bit of logic "1" level is read out to the outside thereof.

As will be understood from the foregoing description, the integration density of the EPROM device shown in FIGS. 3 to 6 is larger than the prior art EPROM device by virtue of the three-dimensional arrangement between the word lines 22A and 22B and the control gate regions 27A to 27D. Moreover, only one contact window 30A or 30B is shared by two adjacent EPROM cells, and the reduction of the contact windows enhances the integration density.

Second Embodiment

Figure 7:
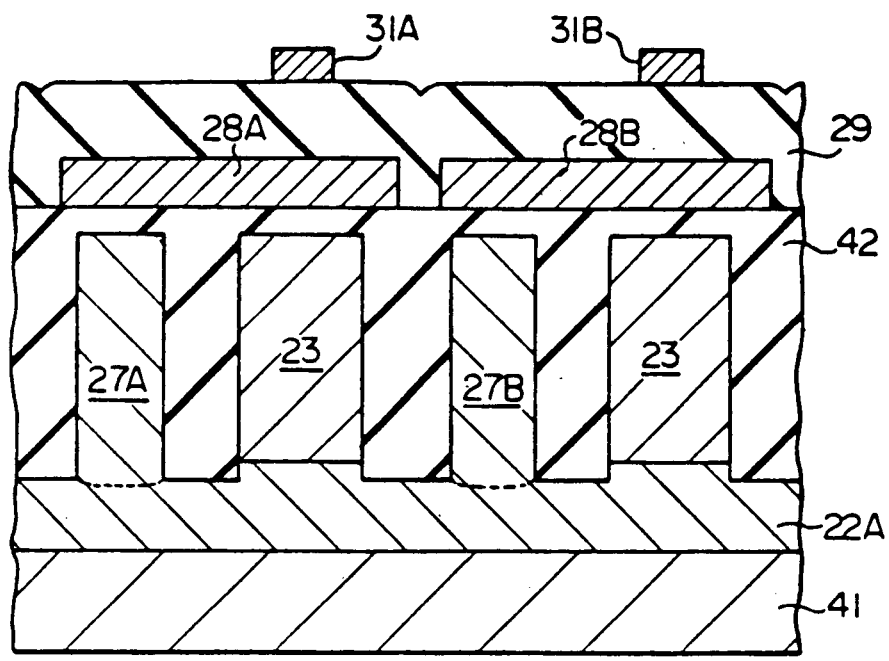
FIG. 7 is a cross sectional view showing the structure of another EPROM device according to the present invention.
Figure 8:
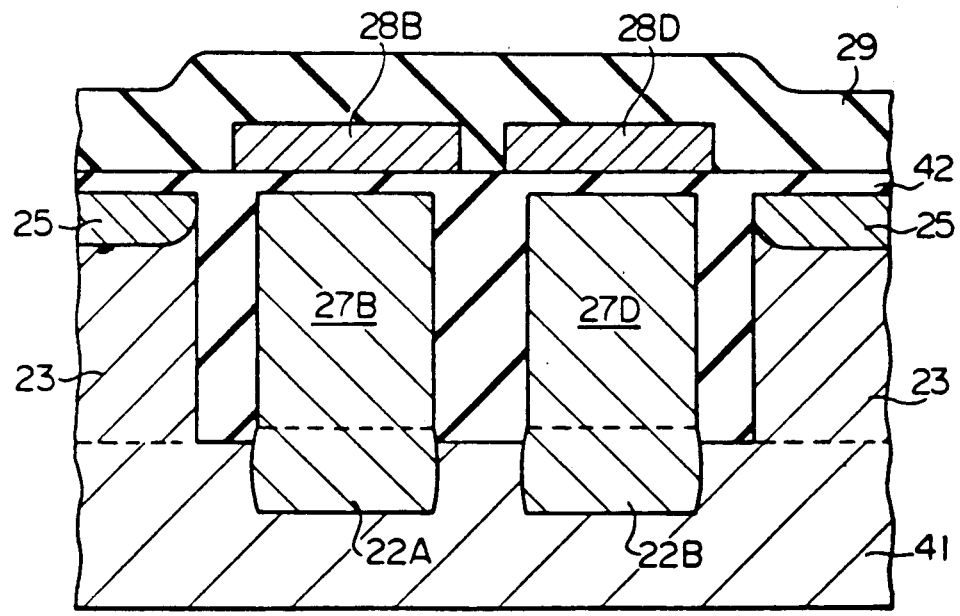
FIG. 8 is a cross sectional view showing the structure of the EPROM device in FIG. 7 at a different angle.

Turning to FIGS. 7 and 8, another EPROM device according to the present invention is illustrated and fabricated on a silicon substrate 41 of the first conductivity type. The layout of the EPROM device is similar to that of the EPROM device shown in FIGS. 3 to 6, and FIGS. 7 and 8 correspond to FIGS. 4 and 6, respectively. The EPROM device shown in FIGS. 7 and 8 are characterized by trench type isolating oxide region 42, but the other component films and regions are similar to those of the EPROM device shown in FIGS. 3 to 6. For this reason, the corresponding films and regions are designated by the same reference numerals without any detailed description. In this instance, the silicon substrate 41 and the trench type isolating oxide region 42 form in combination a semiconductor substrate structure.

The trench type isolating oxide region 42 is formed in the epitaxial layer 23, and the trench type isolating oxide region 42 is produced as follows. After the formation of the epitaxial layer 23, a mask layer is patterned thereon by using a lithographic process, and the exposed portions of the epitaxial layer 23 is subjected to ion bombardment in a reactive ion etching process. The exposed portions are then removed, and trenches are left in the epitaxial layer 23. Silicon oxide is deposited on the entire surface of the epitaxial layer 23, and the silicon oxide film thus deposited projects over the top surface of the epitaxial layer 23. Subsequently, the silicon oxide film is uniformly etched away so as to create a smooth top surface, and the trenches are filled with the silicon oxide.

The trench type isolating oxide region 42 is desirable in view of the large write-in voltage level Vpp. In detail, the larger the write-in voltage level Vpp, the shorter the write-in cycle is achieved. The larger write-in voltage level Vpp is desirable for speed-up of the write-in mode of operation, and the write-in voltage level Vpp is dominated by the restriction of the parasitic channel beneath the thick portion 24A. However, in the EPROM device shown in FIGS. 7 and 8, each of the control gate region 27A, 27B or 27D is surrounded by the trench type isolating oxide region 42, and, accordingly, no parasitic channel takes place. This results in that the write-in voltage level Vpp can be adjusted to a higher level than that of the EPROM device shown in FIGS. 3 to 6, and the higher write-in voltage level Vpp is conducive to reduction of the time period consumed in the write-in mode of operation. Moreover, the higher write-in voltage level results in a wide voltage range between logic "0" level and logic "1" level which in turn a large noise margin for the selecting signal. The trench type isolating oxide region allows the control gate regions 27A and 27B to be closer than the EPROM device shown in FIGS. 3 to 6, and, therefore, a larger integration density is achieved by the structure shown in FIGS. 7 and 8.

Although particular embodiments of the present invention have been shown and described, it will be obvious to those skilled in the art that various changes and modifications may be made without departing from the spirit and scope of the present invention.

What is claimed is:

1. A non-volatile semiconductor memory device fabricated on a semiconductor substrate structure of a first conductivity type, comprising:
  a) a plurality of doped regions of a second conductivity type respectively serving as word lines and formed in said semiconductor substrate structure; and
  b) a plurality of memory cells divided into a plurality of groups respectively coupled to said plurality of doped regions and memorizing data bits in a non-volatile manner, respectively, in which each of said memory cells comprises b-1) a control gate region of said second conductivity type formed in said semiconductor substrate structure and extending from one of said doped regions to a major surface portion of the semiconductor substrate structure, b-2) a first gate insulating film covering a top surface of said control gate region, b-3) a source region of said second conductivity type formed in the major surface portion of said semiconductor substrate structure and isolated from said control gate region, b-4) a drain region of said second conductivity type formed in the major surface portion of said semiconductor substrate structure and spaced from said control gate region and said source region, b-5) a second gate insulating film provided over that area between said source and drain regions, and b-6) a floating gate electrode extending from said first gate insulating film to said second gate insulating film.

2. A non-volatile semiconductor memory device as set forth in claim 1, in which said semiconductor substrate structure comprises a semiconductor substrate of said first conductivity type and an epitaxial layer of said first conductivity type grown on the semiconductor substrate.

3. A non-volatile semiconductor memory device as set forth in claim 2, in which said doped region is formed in said semiconductor substrate and extends through said epitaxial layer.

4. A non-volatile semiconductor memory device as set forth in claim 3, in which said floating gate electrode extends over a thick insulating film between said first and second gate insulating films.

5. A non-volatile semiconductor memory device as set forth in claim 6, in which said non-volatile semiconductor memory device further comprises an inter-level insulating film covering said floating gate and formed with a contact window, and a metal wiring strip extending on the interlevel insulating film and contacting said drain region through said contact window.

6. A non-volatile semiconductor memory device as set forth in claim 1, in which said semiconductor substrate structure comprises a semiconductor substrate of said first conductivity type, an epitaxial layer of the first conductivity type and a trench type isolating oxide region formed in the epitaxial layer.

7. A non-volatile semiconductor memory device as set forth in claim 6, in which said trench type isolating oxide region is contiguous to said first and second gate insulating films.

8. A non-volatile semiconductor memory device as set forth in claim 7, in which said non-volatile semiconductor memory device further comprises an inter-level insulating film covering said floating gate and formed with a contact window, and a metal wiring strip extending on the interlevel insulating film and contacting said drain region through said contact window.

* * * * *